United States Patent [19]

Depuy et al.

[11] 3,842,491

[45] Oct. 22, 1974

[54] MANUFACTURE OF ASSORTED TYPES OF LSI DEVICES ON SAME WAFER

[75] Inventors: Arthur H. Depuy, Essex Center, Vt.; Leonard F. Johnson; Stanley Scheinberg, both of Poughkeepsie, N.Y.

[73] Assignee: International Business Machines Corporation, Armonk, N.Y.

[22] Filed: Dec. 8, 1972

[21] Appl. No.: 313,366

[52] U.S. Cl. .................................... 29/580, 29/574

[51] Int. Cl. .......................... B01j 17/00, H01l 5/00

[58] Field of Search ............. 29/574, 577, 578, 580

[56] References Cited

UNITED STATES PATENTS

| | | | |
|---|---|---|---|
| 3,385,702 | 5/1968 | Koehler | 96/36.2 |
| 3,577,038 | 5/1971 | Cook | 29/577 |
| 3,702,025 | 11/1972 | Archer | 29/574 |
| 3,720,309 | 3/1973 | Weir | 29/574 |
| 3,762,037 | 10/1973 | Baker et al. | 29/577 |

OTHER PUBLICATIONS

Gupta, Anoil & J. W. Lathrop, "Yield Analysis of Large Integrated-Circuit Chips," IEEE Journal of Solid-State Circuit, Vol. SC-7, No. 5, October, 1972, pp. 389-395.

*Primary Examiner*—Roy Lake
*Assistant Examiner*—R. Daniel Crouse
*Attorney, Agent, or Firm*—Robert Lieber

[57] ABSTRACT

Multiple LSI (Large Scale Integrated) semiconductor devices (chips) of assorted types (different design and function, representing different assembly parts or devices) are fabricated in aggregate on one integral wafer crystal. A multitype composite mask or procedural equivalent is used. In specific instances this results in distinct savings in production apparatus, test apparatus, procedures and materials usage; e.g., low quantity multitype custom production runs. Devices of each desired type are scheduled for production in prescribed areas of the wafer. The areas are laid out as a function of pre-assessed yield probabilities and pre-established quantity requirements for the individual types. The wafer areas are allocated so as to optimize potential device yields in each type category; in the ultimate case to yield at least one useful device of each type.

3 Claims, 2 Drawing Figures

TYPICAL
WAFER YIELD BY P/N:

| LOCATION: | | |
|---|---|---|
| | A | 6.89 % |
| | B | 12.86 % |
| | C | 12.29 % |
| | D | 14.23 % |
| | E | 15.83 % |
| | F | 17.23 % |
| | G | 14.97 % |
| | H | 13.68 % |

MANUFACTURE OF ASSORTED TYPES OF LSI DEVICES ON SAME WAFER

FIELD OF THE INVENTION

The invention relates to a method of making various types of LSI semiconductor devices (chips) simultaneously and to masks or equivalent imaging apparatus particularly suited thereto.

DESCRIPTION OF THE PRIOR ART

A typical prior art process for making microminiature LSI devices comprises steps of: forming a mask, using the mask to form an aggregate of multiple essentially identical chip devices on an integral wafer crystal, preparing a test tape, testing the devices, mapping (recording) locations of defective devices, sectioning (dicing) the wafer at chip boundaries and segregating satisfactory from unsuitable devices by reference to the test record. Devices of different circuit construction (i.e., different type category, different design "personality," etc.) are formed on different wafers from respectively different masks. This process will be referred to hereafter as "uni-type" production.

A disadvantage of this process is that the cost of a small quantity production run (e.g., for custom specified applications) may not be significantly less than the cost of a large quantity run since major expenses are incurred in the preparation of the masking (imaging) and test procedures. Hence this process can be inefficient. Also, if production for any reason should be defective (resulting in low yield per wafer) the inefficiency is compounded.

Another disadvantage is that in a small quantity production run requiring a number of devices less than the total defectfree yield capacity of one wafer there is even more inefficiency and waste of materials.

SUMMARY OF THE INVENTION

Above disadvantages are overcome by the present invention. Mapping the wafer crystal into area sections of distinct pre-assessed yield capability we proceed to form aggregates of multiple devices of different type category or "styling" in each section. We then test the devices in a programmed multitype test sequence prepared therefor (e.g., automatically under punch tape control) and record the position (relative to a fiducial), type and usefulness condition of each device. Next we section (dice) the wafer at device boundaries and remove unsuitable devices by referring to the test result record. Finally we sort the useful devices by type category (and in certain instances by quality within type categories).

Hence with a single compound mask or equivalent imaging apparatus (e.g., program-controlled radiation beam) and with a single compound test plan, we fulfill low quantity requirements for a plurality of device types with optimum efficiency. Even if the mask is partially defective the present method may be used successfully if devices of each type category are suitably distributed over the wafer surface according to the pre-assessed yield gradient of the wafer.

Accordingly, an object of the invention is to provide an economical method for simultaneously constructing and testing quantities of microminiature integrated circuit semiconductor devices of various types in order to fulfill low quantity production requirements for each type.

Another object is to provide a method for assuring optimal quantity yields of devices in each type category.

Yet another object is to provide production means suitable for practicing said method.

Foregoing and other objects, features and advantages of our invention will be apparent from the following particular description and accompanying drawing wherein FIG. 1 represents a flow diagram of the claimed process and FIG. 2 illustrates a typical wafer layout in accordance with the invention.

DETAILED DESCRIPTION

Figure 1:
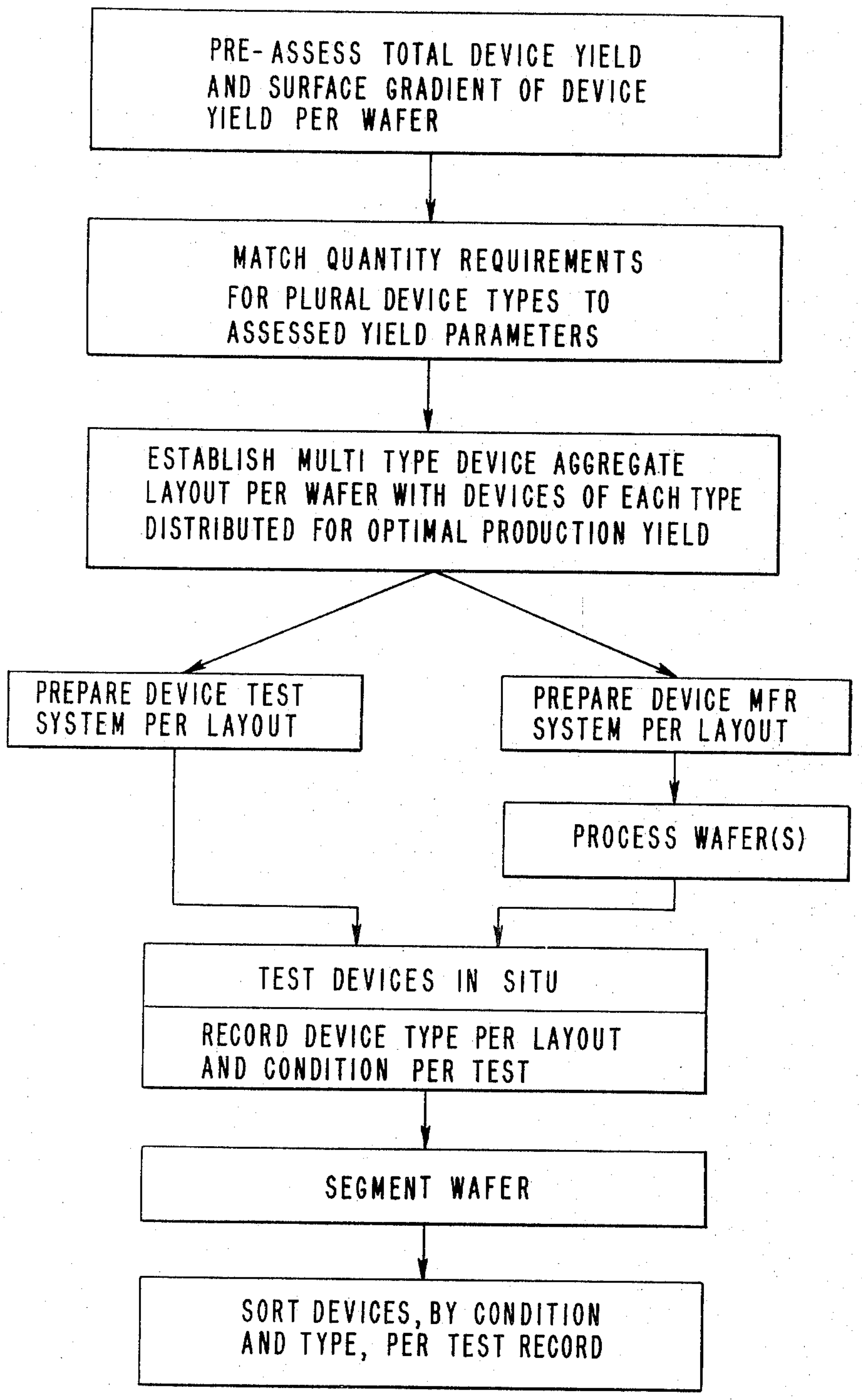

As indicated in FIG. 1 the subject method involves the steps of: pre-assessing probable device yield and probable surface gradient of device yield for a wafer of known physical size and composition; determining and matching the quantity requirements for multiple distinct types to the assessed yield parameters; establishing a basic multitype device layout designed for optimal quantity yields in all type categories; preparing a program (tape) or system for testing a multitype device aggregate configured according to the basic layout; photo-image processing one or more wafers to form on each an aggregate of multiple device types positioned in accordance with the basic layout; testing the individual devices of the aggregate with the prepared test program and recording type, location and condition of each device; sectioning (dicing) the wafer into discrete devices; segregating defective and satisfactory devices in accordance with the test record; and finally sorting the satisfactory devices by type (and, if desired, by quality).

The foregoing steps are accomplished specifically as follows:

Pre-assess Total Yield Probability and Probable Area Gradient of Yield Per Wafer The above yield probability parameters are pre-assessed for a wafer of specific size and composition from statistics of past yields for uni-type production on such wafers. The statistics naturally should take into account actual yield per total wafer and actual yield per discrete sub-areas of wafers. Experience indicates that the yield gradient usually has a radial progression, for a disc shaped wafer, with highest yield centrally and lowest peripherally.

Determine and Match Quantity Requirements for Multiple Device Types to Assessed Yield Parameters Quantity requirements per device type will vary according to the type and the assembly applications in which the device will be used. Matching such to the assessed yield parameter involves straightforward production engineering. The objective, of course, is to optimize wafer usage and fulfill the entire production need for all co-produced device types with minimum waste of materials and other resources.

Layout Preparation

A bill of particulars is prepared specifying locations of individual devices of each type in relation to a fiducial orientation mark on the wafer crystal; in accordance with the matching determination above. A sufficient mixture of devices of each type is scheduled in the highest yield center area of the wafer and in the lower yield peripheral "rings" to assure sufficient quantity yields of useful devices of each type under "worst case" yield circumstances.

Test Preparation

The test, whether automatic or manual, comprises a series of "step and repeat" test probing operations alternating with recording operations. Devices of different types will preferably have identical form factors (i.e., identically configured probing pads) and different electrical parameters. The individual devices are positionally located on the wafer with respect to the above-mentioned fiducial (or equivalent position reference). If the test is automated by use of a program (e.g., punch tape) the instructions required to probe the device and to record its location, type and condition are written in accordance with the layout.

Wafer Processing

A. Mask Preparation

The mask, or equivalently the system for controlling a radiant energy beam to "step, image and repeat," is prepared in accordance with the layout above to provide for co-fabrication of devices of each type in aggregate in the desired gradient distribution.

In a typical case of wafer was found capable of supplying quantity requirements for eight distinct types of devices. The mask contained the image transfer function necessary to produce at least one defect-free device of each type in the highest yield central area of the wafer (i.e., to yield at least eight devices in the center) and overall to yield a number of devices of each type proportional to the total production requirement for the respective type. Thus, with the yield gradient configured in radial progression and with equal yield quantities required per type, devices of each type are located alternately at consecutive layout positions of the central and peripheral circular areas of the wafer. On the other hand, if unequal quantity requirements are specified for the various types then the distribution within each gradient yield area is varied appropriately by imaging quantities $n_1$ of type 1 devices, $n_2$ of type 2 device and so forth, in succession in each area subject however to allowance for obtaining at least one defect-free device of each type.

B. Test

The devices formed as above are tested in situ on the unsectioned wafer using the above-mentioned test program and appropriate positioning apparatus. Conventional positioning and probing assemblies are utilized. For each device a test record is made (e.g., on a punched card) which includes the location relative to the fiducial, the device condition (e.g., defect-free, partially defective, completely defective, etc.) and its type.

C. Dice and Sort

The wafer is sectioned into discrete devices by conventional dicing apparatus and procedures. The discrete devices are sorted according to type and condition with reference to the test record. One way of accomplishing the sorting is to releasably support the wafer before it is diced on a suitable separable adhesive support (e.g., a phenolic support member with an adhesive film coating contacting the wafer). The supported wafer may then be diced by conventional procedures which preserve the integrity of the support (e.g., laser) and the individual separated devices on the support may then be located for release and sorting by referring to the fiducial and the test record. It will be appreciated that the particular means employed to hold the diced aggregate for sorting is not relevant to the invention and that any arrangement will be suitable which permits sectioned devices to retain their positions relative to the locating fiducial.

As noted above,the devices may be sorted by type and also by quality condition within each type category. This is specified in contemplation of the possible use of partially defective devices with internal redundancy when the use of such is permitted. Obviously, if only defect-free devices are to be utilized then it will suffice to sort only the defect-free devices by type category.

Specific Example (8 Types)

Figure 2:
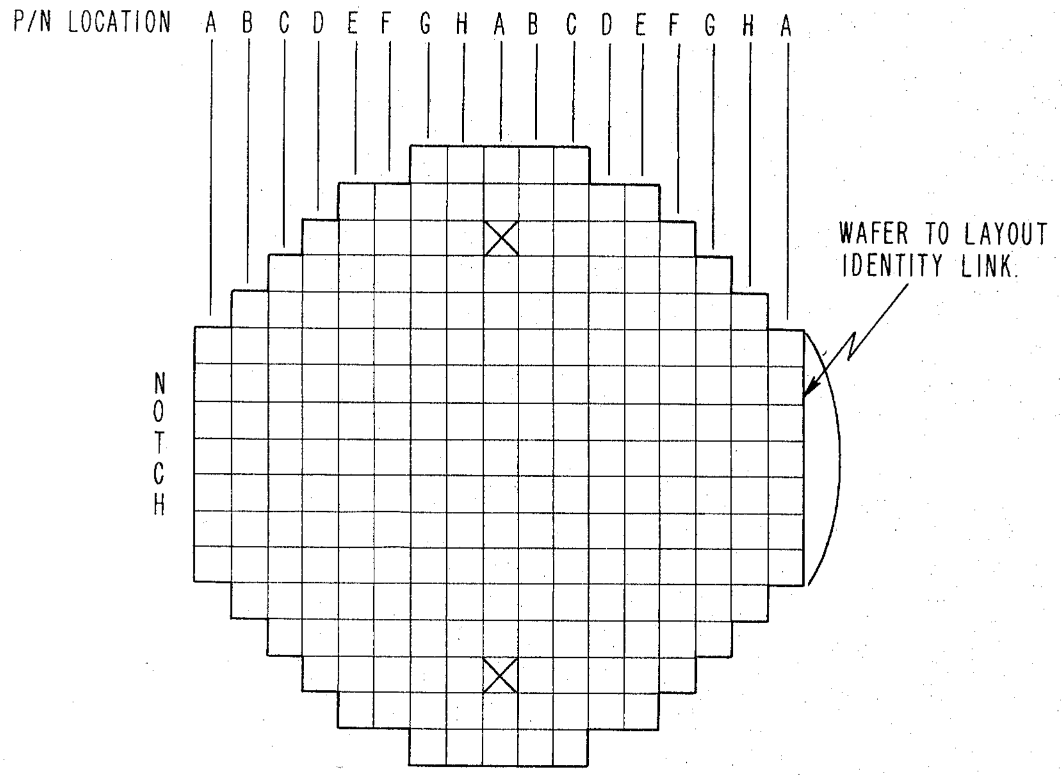

FIG. 2 illustrates a particular wafer layout for an exemplary 8 part number aggregate. Letters A–H identify row coordinates of the wafer locatable with respect to the fiducials which in turn ave fixed relation to the notch. In the illustration each row contains devices of one part number type as follows:

| | | |
|---|---|---|
| Row | A B C D E F G H | A B . . . . |
| Part No. | 1 2 3 4 5 6 7 8 | 1 2 . . . . |

(in all respective row positions)

With this configuration the yield per part number is that indicated for the respective row. For different yield requirement the layout would be varied.

While the invention has been particularly shown and described with reference to a preferred embodiment thereof, it will be understood by those skilled in the art that the foregoing and other changes in form and detail may be made therein without departing from the spirit and scope of the invention.

What is claimed is:

1. A method of efficiently making predetermined quantities of each of a plurality of distinct types of differently structured LSI device units from a segmented wafer of predetermined form and composition comprising:

preparing a layout, representing a mapping of multiple devices of each said type upon a specific surface portion of said wafer having substantially uniform yield characteristics throughout the area thereof, said mapped devices arranged in a predetermined intermixed distribution of said types;

processing and segmenting said wafer in accordance with said layout to yield plural devices of each said type, including both operative and inoperative devices; the anticipated yields of operative devices of each said type being equal to or in excess of predetermined requirement numbers pre-specified for the respective types due to said intermixed distribution.

2. A method of efficiently making plural different types of LSI devices in predetermined quantities from one predetermined type of segmentable wafer comprising:

preparing a device layout, representing a mapping upon each of a plurality of discrete surface sections of said wafer of multiple devices of each said type positionally interspersed by type in a predetermined distribution within each said section; each said section having substantially constant yield characteristic throughout the area thereof;

processing and segmenting a said wafer according to said layout to produce anticipated yields of operative and inoperative devices of such said type; the anticipated yield of operative devices of each said type being equal to or exceeding a predetermined required yield number prespecified for the respective device type;

processing said operative and inoperative devices selectively by type to segregate said operative devices from the inoperative devices and to further segregate the operative devices of each type from the devices of other type.

3. In a method of multi-type device production according to claim 2, the steps of:

selecting, for use as said wafer, a wafer of a type previously utilized in large numbers for mass production of devices of the predetermined type; and basing said layout preparation upon statistics of device yield per wafer area section developed in connection with production handling of said previously utilized wafers.

* * * * *